United States Patent
Korson et al.

(10) Patent No.: US 7,268,571 B1
(45) Date of Patent: Sep. 11, 2007

(54) METHOD FOR VALIDATING AND MONITORING AUTOMATIC TEST EQUIPMENT CONTACTOR

(75) Inventors: Michael Patrick Korson, Plano, TX (US); Amiel Esquivias Lagadan, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/384,793

(22) Filed: Mar. 20, 2006

(51) Int. Cl.
*G01R 31/02* (2006.01)
(52) U.S. Cl. .................................... 324/763; 324/158.1
(58) Field of Classification Search ..................... None
See application file for complete search history.

(56) References Cited

U.S. PATENT DOCUMENTS

| | | | | |
|---|---|---|---|---|
| 3,611,125 A | * | 10/1971 | Press et al. | 324/715 |
| 3,735,254 A | * | 5/1973 | Severin | 324/716 |
| 5,386,188 A | * | 1/1995 | Minneman et al. | 324/126 |
| 5,804,979 A | * | 9/1998 | Lund et al. | 324/713 |
| 5,933,309 A | * | 8/1999 | Smith | 361/88 |
| 5,945,837 A | * | 8/1999 | Fredrickson | 324/761 |
| 6,791,344 B2 | * | 9/2004 | Cook et al. | 324/754 |
| 7,135,876 B2 | * | 11/2006 | Petersen et al. | 324/756 |

* cited by examiner

*Primary Examiner*—Ha Tran Nguyen
*Assistant Examiner*—Richard Isla-Rodas
(74) *Attorney, Agent, or Firm*—Yingsheng Tung; Wade James Brady, III; Frederick J. Telecky, Jr.

(57) ABSTRACT

A method and apparatus is provided for characterizing a contactor for automated semiconductor device testing, the method first comprising placing the contactor on a contactor test board positioned within an automated test apparatus. A first probe of the automated test apparatus is contacted to a conductive layer of the contactor test board, and a second probe is placed on a contactor pin of the contactor, wherein the contactor pin is operable to linearly translate within the contactor. A predetermined pressure is applied to the contactor pin via the second probe, wherein the contactor pin is translated toward the contactor test board. An electrical characteristic of the contactor pin is measured between the first probe and the second probe and compared to a desired electrical characteristic, wherein a condition of the contactor pin is determined, based on the comparison of the measured electrical characteristic and the desired electrical characteristic.

20 Claims, 5 Drawing Sheets

METHOD FOR VALIDATING AND MONITORING AUTOMATIC TEST EQUIPMENT CONTACTOR

FIELD OF THE INVENTION

The present invention relates generally to automatic testing equipment for semiconductor devices, and more particularly to a method and apparatus for characterizing a contactor for use in testing the semiconductor devices.

BACKGROUND OF THE INVENTION

In the semiconductor industry, integrated circuits (ICs) are typically tested in wafer form prior to being packaged. That is, a wafer comprising a multitude of ICs is tested prior to dicing the wafer into individual chips. During this testing, the integrated circuits are individually tested on a wafer, and appropriate action is taken if the testing indicates that predetermined specifications are not met. After dicing, the individual chips are then packaged into a multitude of semiconductor packages, wherein the integrated circuits are electrically coupled to electrical contacts, such as for subsequent attachment to a printed circuit board (PCB). Once the chips are packaged, each semiconductor package is again tested, where again, appropriate action is taken if predetermined electrical specifications are not met.

Conventionally, manufactured semiconductor packages are tested in automatic test equipment (ATE), wherein the semiconductor package is inserted into a "contactor", and wherein the electrical contacts of the semiconductor package contact and depress a plurality of spring-biased contactor pins, also called "pogo" pins. The contactor pins of the contactor generally provide a temporary electrical connection between the electrical contacts of the semiconductor package to a test PCB or test board. The test board, in conjunction with the contactor, is configured to electrically test the circuits of the circuit board prior to final assembly of the semiconductor package on a PCB.

One common problem with conventional contactors is that the contactor pins are generally considered a "wear item" of the contactor, wherein individual contactor pins may wear and/or become faulty due to wear, contamination, bending, or various other reasons. Faulty contactor pins, and thus faulty contactors, can result in continuity problems between the test board and the semiconductor package to be tested, as well as potential lost yield if the test apparatus is not monitored properly. Accordingly, in order to prevent such problems, the contactor pins are typically replaced throughout the operational life of the contactor.

FIG. 1, for example, illustrates a conventional method 10 for determining the repair and/or replacement of contactor pins in a contactor. The method 10 begins with inserting a complete set of new contactor pins into a test contactor in act 15. In act 20, a predetermined number of semiconductor packages are tested via the contactor, wherein upon reaching the predetermined number of packages tested, the entire set of contactor pins are removed from the contactor in act 25, and the method repeats itself by again inserting another complete set of contactor pins into the contactor again in act 15. Such a complete replacement of contactor pins is generally blind to whether any of the pins are actually defective, but rather, the predetermined number of tested packages is typically determined by estimates of when the pins should be replaced based on past experience. Clearly, such wholesale replacement can be disadvantageous, since it is likely that some, if not all, of the contactor pins may still have useful life, and the wholesale replacement thereof can have significant cost implications.

Conventionally, there is no off-line method or machine that allows automated diagnosis, measurement or verification of each contactor pin in the contactor. Accordingly, contactor pin performance over time has not been well understood, but rather, contactor pin replacement has been done either piecemeal by manual tests of the contactor pins, or by the wholesale replacement illustrated in FIG. 1, wherein repair of contactor pins and/or cleaning frequency has been typically based on fixed intervals and/or assumptions made concerning the condition of the pins.

Therefore, a need currently exists for an improved method for testing, validating, and monitoring devices such as contactors used in testing semiconductor devices. Accordingly, a reliable and cost-effective method for generally automatically characterizing a contactor device is desirable, wherein the contactor device can be not only readily tested such that actual data about the status of the contactor is achieved, but the subsequent use of the contactor device for testing semiconductor devices can be made more reliable to achieve improvements towards the goals of enhanced yields and device reliability. Furthermore, such a method should increase productivity of the contactor device, such that the problems associated with wholesale replacement of contactor pins and/or time-consuming manual testing of the contactor pins are ameliorated.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a novel method and apparatus for characterizing a contactor that is used in automated testing of semiconductor IC packages. According to the present invention, the method comprises placing the contactor on a contactor test board, wherein the contactor comprises a plurality of contactor pins operable to linearly translate within the contactor. The contactor test board, for example, may be further positioned within an automated test apparatus having first and second probes. In one example, the contactor test board comprises a first electrically conductive layer defining a first surface of the contactor test board, wherein a contactor pin contacting region and a probe contacting region are defined on the first surface of the contactor test board.

According to the present invention, a first probe of the automated test apparatus is contacted to the first conductive layer of the contactor test board in the probe contacting region, and a second probe is contacted to one of the plurality of contactor pins of the contactor. The first probe may be alternatively contacted to a second electrically conductive layer disposed on a backside of the contactor test board, wherein the second electrically conductive layer and first electrically conductive layer are electrically connected to one another. In accordance with one example, a predetermined pressure is applied to the contactor pin via the second probe, wherein the contactor pin is translated toward the contactor test board. An electrical characteristic of the contactor pin is then measured between the first probe and the second probe, and the electrical characteristic may then be utilized to determine a condition of the contactor pin. For example, the measured electrical characteristic, such as a resistance, inductance, or capacitance, is compared to a respective desired electrical characteristic, and based on the comparison of the measured electrical characteristic and the desired electrical characteristic, a determination can be made as to the condition of the contactor pin. Once the condition is determined, action can be taken to either remove, repair, and/or replace the contactor pin. Alternatively, the condition of the plurality of contactor pins can be monitored to determine when such removal, repair, and/or replacement may become necessary.

According to another aspect of the invention, a universal contactor test board is provided, wherein the universal contactor test board is utilized for automated testing of a contactor with and automated test apparatus. The universal contactor test board comprises a base board having a first electrically conductive layer disposed thereon, wherein one or more contactor footprints are defined on the first surface of the universal contactor test board. The one or more contactor footprints are generally defined by one or more holes through the base board and first electrically conductive layer, wherein the one or more holes are associated with one or more locating pins of one or more differing contactors.

The universal contactor test board further comprises a contactor pin contacting region associated with each contactor footprint, wherein one or more contactor pins associated with the respective one or more differing contactors are operable to be positioned over the contactor pin contacting region when the one or more locating pins of the particular contactor are inserted into the one or more holes in the base board and first electrically conductive layer. According to the invention, the universal contactor test board also comprises a first probe contacting region defined thereon, wherein a first probe of the automated test apparatus is operable to electrically contact the universal contactor test board in the first probe contacting region, and wherein the first probe contacting region and the contactor pin contacting region are electrically connected via the first electrically conductive layer. The universal contactor board can thus be utilized for characterization of one or more differing contactor styles, such as via the above described method.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
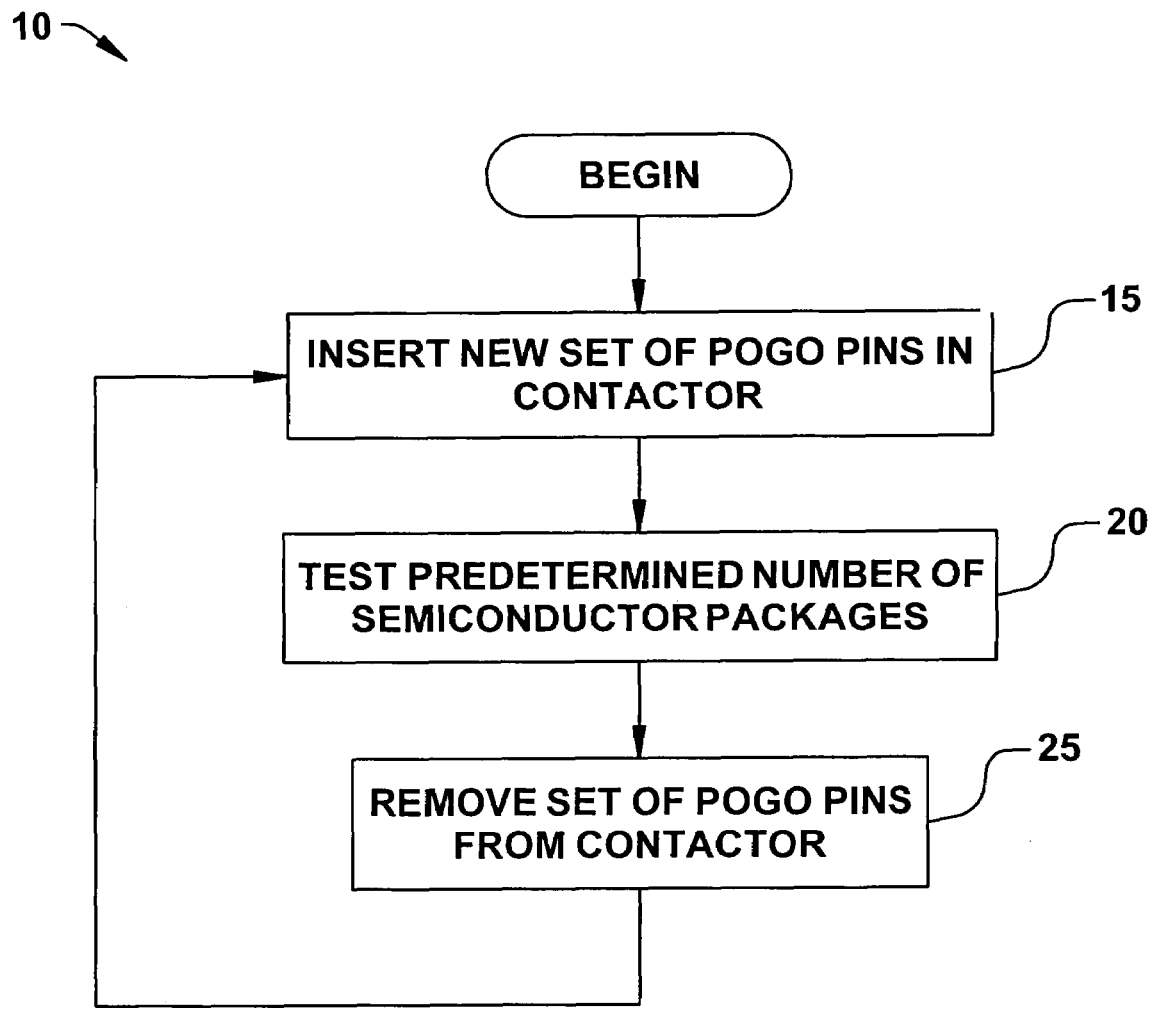
FIG. 1 is a block diagram of a conventional method for determining repair or replacement of contactor pins of a contactor.

The present invention is directed towards a method for testing, validating, and monitoring devices used in automatic testing equipment for semiconductor devices. More particularly the method of the present invention provides automated characterization, validation, and monitoring of a contactor used in testing the semiconductor devices. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2A:
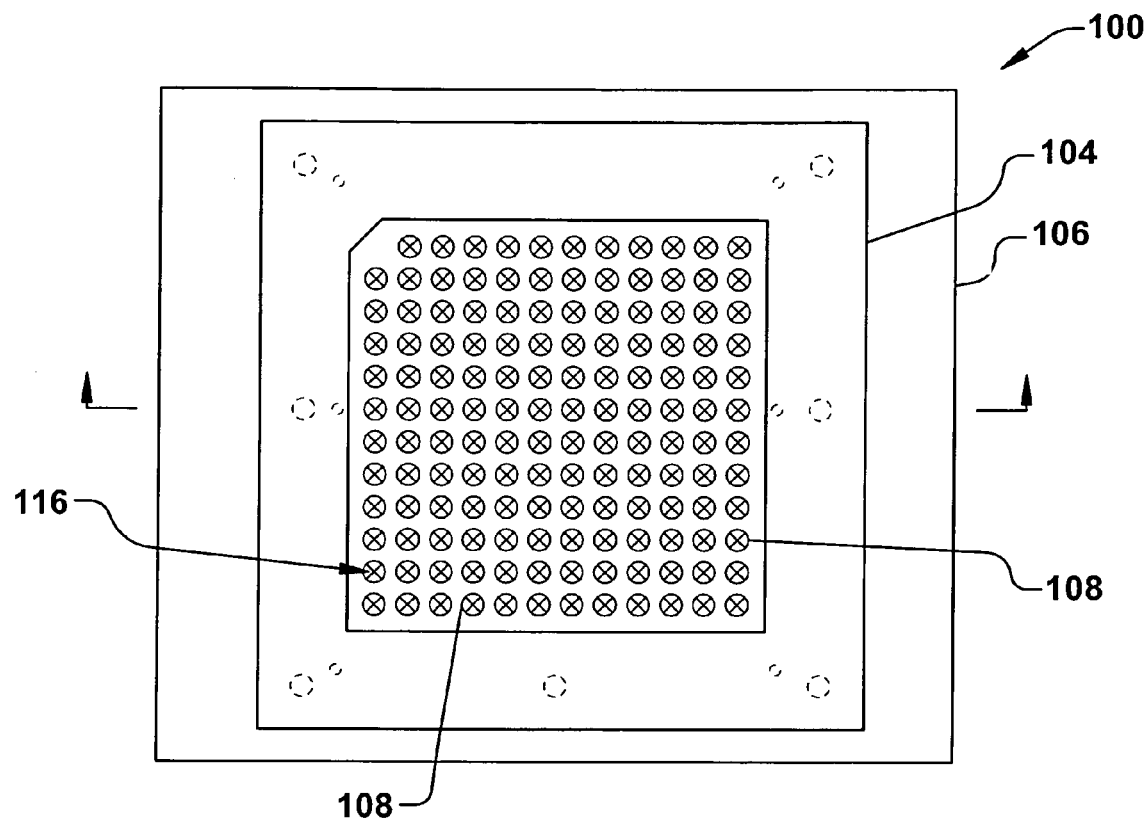
FIG. 2A is a plan view of a semiconductor device test fixture according to one aspect of the present invention.
Figure 2B:
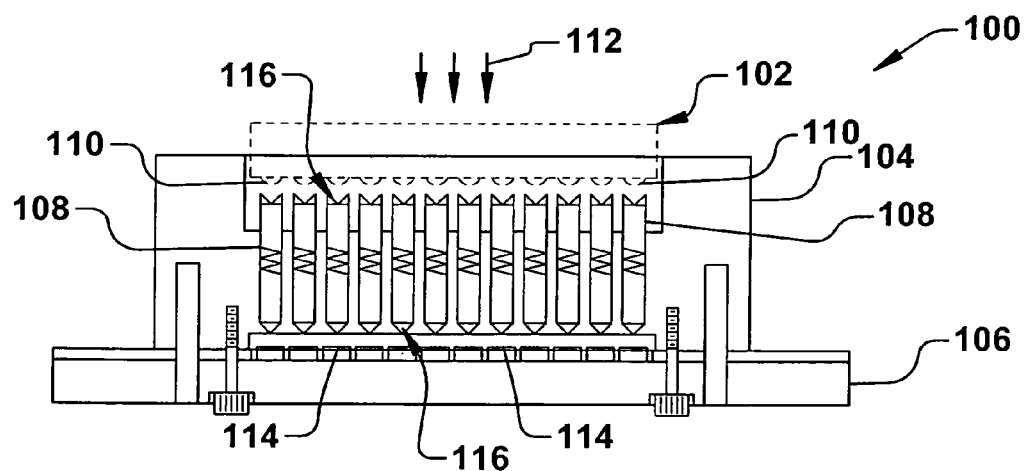
FIG. 2B is a cross-sectional view of the test fixture of FIG. 2A illustrating a contactor having contactor pins according to another aspect of the present invention.

Referring now to the figures, FIG. 2A illustrates a simplified plan view of a test fixture 100 used in automated testing of a semiconductor device (shown in phantom in FIG. 2B), such as an integrated circuit package 102. The test fixture 100 of FIGS. 2A and 2B, for example, comprises a contactor 104 mounted on a test printed circuit board (PCB) 106, wherein the contactor comprises a plurality of spring-biased contactor pins 108, commonly referred to as "pogo pins", associated with electrical contacts 110 of the IC package 102 to be tested. For example, the contactor 104 illustrated in FIG. 2A comprises roughly a 12-by-12 matrix of contactor pins 108 configured to contact a respective 12-by-12 matrix of electrical contacts 110 of the associated IC package 102 illustrated in FIG. 2B.

In order to test electrical characteristics of various circuits of the IC package 102, the IC package is placed on the contactor 104 such that the electrical contacts 110 of the IC package come into contact with the plurality of contactor pins 108. Downward pressure 112 applied to the IC package 102, for example, generally translates the plurality of contactor pins 108 downward until the contactor pins contact a plurality of board contacts 114 of the test PCB 106, wherein the plurality of contactor pins generally provide continuous electrical paths between the electrical contacts 110 of the IC package to the respective plurality of board contacts 114 of the test PCB. Accordingly, various electrical tests can be performed on the circuitry of the IC package 102 via the test PCB 106, as will be understood by one of ordinary skill in the art. It should be noted that the illustrated contactor pins 108 are just one example of mechanically-actuated contactor pins, and that any mechanical contactor pin (e.g., a compression-style contactor pin) operable to provide an electrical connection to the test PCB 106 is contemplated as falling within the scope of the present invention.

Figure 3A:
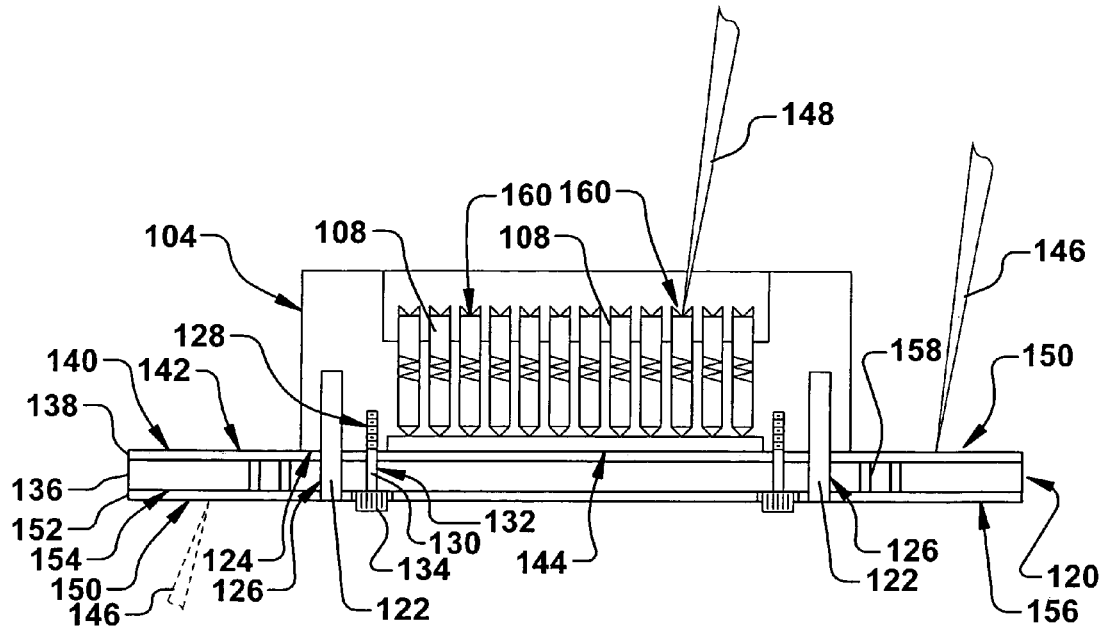
FIG. 3A is a cross-sectional view of a contactor mounted to a contactor test board according to yet another aspect of the present invention.
Figure 3B:
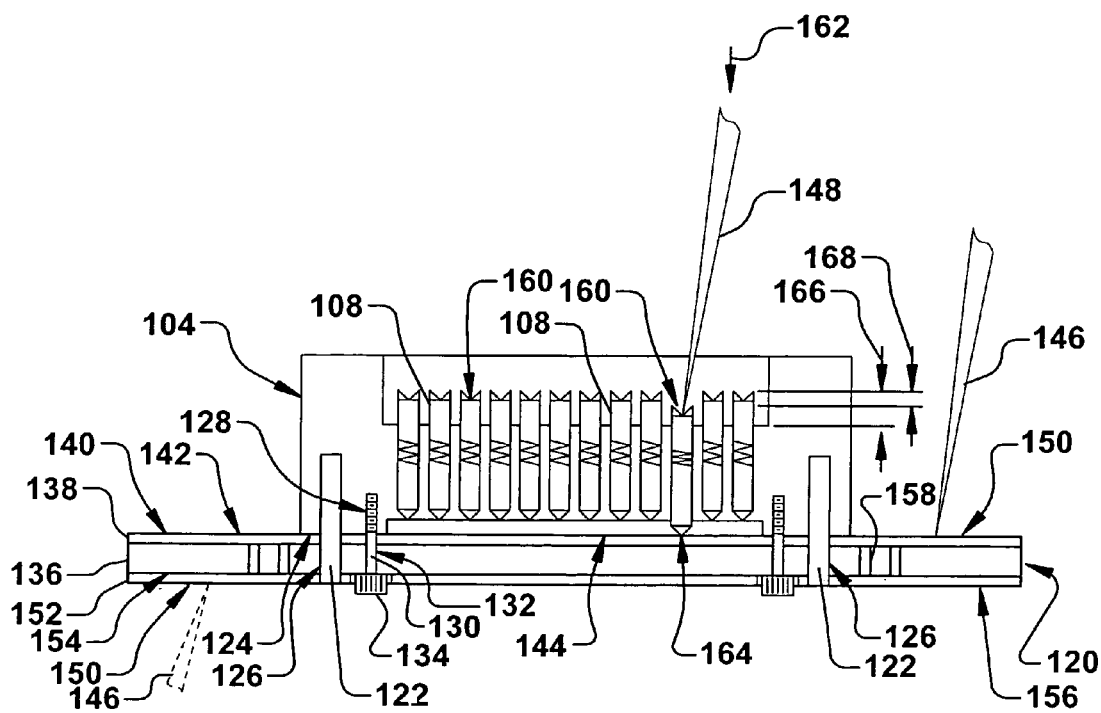
FIG. 3B is a cross-sectional view of the contactor and contactor test board of FIG. 3A illustrating a positioning of probes of an automated test apparatus according to another aspect of the present invention.

Over time, however, the plurality of contactor pins 108 tend to wear and/or accumulate contamination (not shown), wherein the electrical path between the IC package 102 and the test PCB 106 may suffer from discontinuities due to wear and/or contamination of ends 116 of the contactor pins 108. Such electrical discontinuities can have deleterious effects on product yield, since circuitry of the IC package 102 may be mistakenly flagged as faulty due to problems associated with the contamination and/or wear of the contactor pins 108 of the contactor 104. Therefore, in accordance with the present invention, the contactor 104 can be removed from the test PCB of FIGS. 2A and 2B and operably coupled to a contactor test board 120, as illustrated in FIGS. 3A and 3B. The contactor test board 120 of FIG. 3A, for example, is operably coupled to an automated test apparatus (not shown), such as a S40 Pilot LX Flying Probe System, manufactured by Seica S.p.A. of Strambino, Italy, as will be discussed hereafter. While one example of an automated test apparatus is described, it will be understood that any flying probe circuit testing apparatus can be used, and the use of any such testing apparatus is contemplated as falling within the scope of the present invention.

As illustrated in FIG. 3A, the contactor 104 to be characterized is placed on the contactor test board 120, wherein, for example, the contactor is generally aligned and fixed in position with respect to the contactor test board. The contactor 104, for example, comprises one or more locating pins 122 extending from a bottom surface 124 thereof, wherein the one or more locating pins are associated with one or more respective alignment holes 126 in the contactor test board. The one or more locating pins 122 generally align and fix the position of the contactor 104 to the contactor test board 120 via an engagement between the one or more locating pins and the one or more respective alignment holes 126. It should be noted that the contactor test board 120 may comprise one or a plurality of differing hole patterns or footprints (not shown) to accommodate a plurality of differing configurations of contactors 104, as will be discussed infra.

According to another example, the contactor 104 comprises one or more threaded holes 128 associated with the bottom surface 124 thereof and extending into the contactor, wherein one or more respective screws 130 are inserted through one or more respective thru-holes 132 in the contactor test board 120 for coupling of the contactor to the contactor test board. For example, the one or more screws 130 threadingly engage the one or more threaded holes 128 associated with the contactor 104, therein sandwiching the contactor 120 test board between the contactor and one or more screw heads 134 of the respective one or more screws.

As illustrated in FIGS. 3A and 3B, the contactor test board 120, for example, comprises a base board 136 having a first electrically conductive layer 138 disposed on a front side 140 thereof, therein defining a first surface 142 of the contactor test board. The base board 136, for example, may be comprised of an electrically insulative material. The first surface 142 of the contactor test board 120, for example, is generally planar, wherein the first electrically conductive layer 138 generally extends along the front side 140 of the base board 136, except for the locations of the one or more alignment holes 126 and one or more thru-holes 132. A contactor pin contacting region 144 is further defined on the first surface 142 of the contactor test board 120, wherein the plurality of contactor pins 108 of the contactor 104 are generally positioned over the contactor pin contacting region 144 when the contactor 104 is aligned and fixed in position on the contactor test board 120.

In accordance with the present invention, the contactor test board 120 (and in the present example, the contactor 104) of the present invention are generally positioned within the automated test apparatus, wherein the automated test apparatus comprises a first probe 146 and a second probe 148 for conducting electrical tests therebetween. The first probe 146 and second probe 148, for example, may comprise what are commonly referred to as "flying probes", wherein the flying probes are operable to translate within a workspace defined by the automated test equipment. The first probe 146 and second probe 148, for example, are operable to translate in three orthogonal directions of a Cartesian coordinate system, based on a control algorithm of the automated test equipment.

According to one example of the present invention, the first probe 146 of the automated test apparatus is operable to electrically contact the first electrically conductive layer 138 of the contactor test board 120 in a first probe contacting region 150 of the contactor test board. As an alternative, the contactor test board 120 may comprise a second electrically conductive layer 152 disposed on a backside 154 of the base board 136, therein defining a second surface 156 of the contactor test board. In such an alternative, the first electrically conductive layer 138 and second electrically conductive layer 152 are generally electrically coupled to one another, such as by one or more vias 158 through the base board 136. Thus, the first probe contacting region 150 may be generally defined by the first probe 146 electrically contacting the second surface 156 of the second electrically conductive layer 152, as illustrated in phantom in FIG. 3B. In accordance with the invention, the first electrically conductive layer 138 and second electrically conductive layer 152 of the contactor test board 120, for example, are comprised of one or more of copper, gold, and nickel, or any other electrically conductive material, wherein the first electrically conductive layer and/or second electrically conductive layer have a low electrical resistance, capacitance, and inductance associated therewith. For example, the first electrically conductive layer 138 and second electrically conductive layer 152 are comprised of copper that is plated with nickel and/or gold.

FIGS. 3A and 3B further illustrate another aspect of the present invention, wherein the second probe 148 of the automated test apparatus is operable to contact a first end 160 of each of the plurality of contactor pins 108. The second probe 148, for example, is operable to linearly translate each contactor pin 108 within the contactor 104 via a downward pressure 162 (as illustrated in FIG. 3B) applied to contactor pin through the second probe, wherein a second end 164 of the contactor pin is operable to contact the first electrically conductive layer 138 in the contactor pin contacting region 144. Each contactor pin 108, for example, is operable to travel a maximum distance 166, as illustrated in FIG. 3B when the contactor 104 is not coupled to the contactor test board 120. However, when the contactor 104 is either coupled to the contactor test board 120, or when the contact is used in the test fixture 100 of FIG. 2A, it is desirable that the contactor pin 108 travel an optimal distance 168 of FIG. 3B. The optimal distance 168, for example, is associated with a minimal wear characteristic of the contactor pin 108 (e.g., a "new" condition), wherein the contactor pin ideally provides an acceptable electrical connection between the IC package 102 and the contactor test PCB 106 of FIG. 2A, or the second probe 148 and the first electrically conductive layer 138 of the contactor test board 120 of FIG. 3B.

Figure 4:
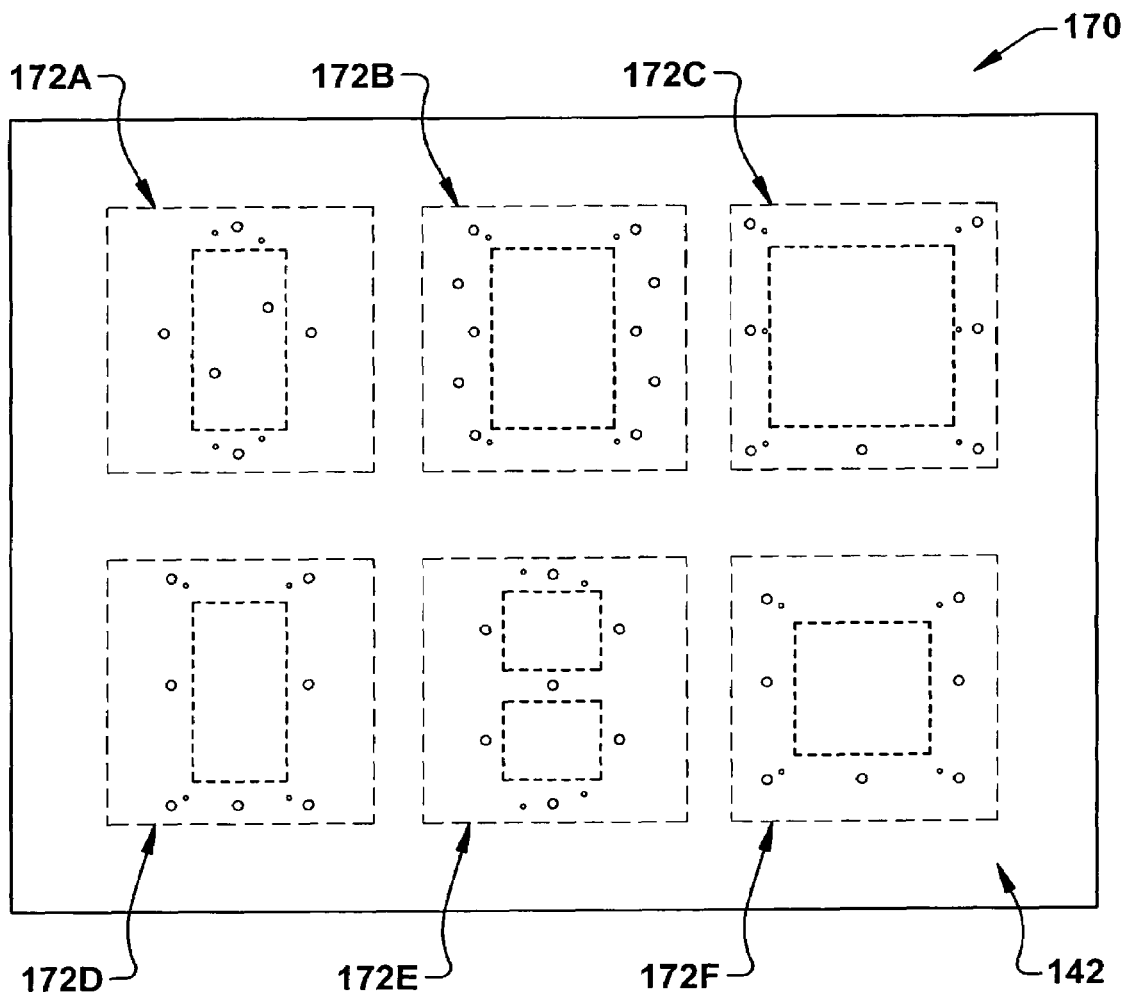
FIG. 4 is a plan view of a contactor board having a plurality of contactor footprints according to yet another aspect of the invention.

FIG. 4 illustrates another inventive aspect of the present invention, wherein a universal contactor test board 170 is illustrated. The universal contactor test board 170, for example, is similar to the contactor test board 120 of FIGS. 3A and 3B, wherein the universal contactor test board further comprises a plurality of contactor footprints 172A-172F defined on the first surface 142 of the universal contactor test board. The plurality of contactor footprints 172A-172F, for example, may differ from one another such that each contactor footprint is associated with a respective contactor having a unique positioning of contactor pins, locating pins, or other features. It should be noted that while a limited number of contactor footprints 172 are illustrated, any number of contactor footprints may be present on the universal contactor test board 170, and are contemplated as falling within the scope of the present invention. Furthermore, two or more of the contactor footprints 172A-172F may be suited for testing the same configuration of contactor 104. Accordingly, the universal contactor test board 170 provides for a plurality of testing configurations using the same automated test apparatus.

Figure 5:
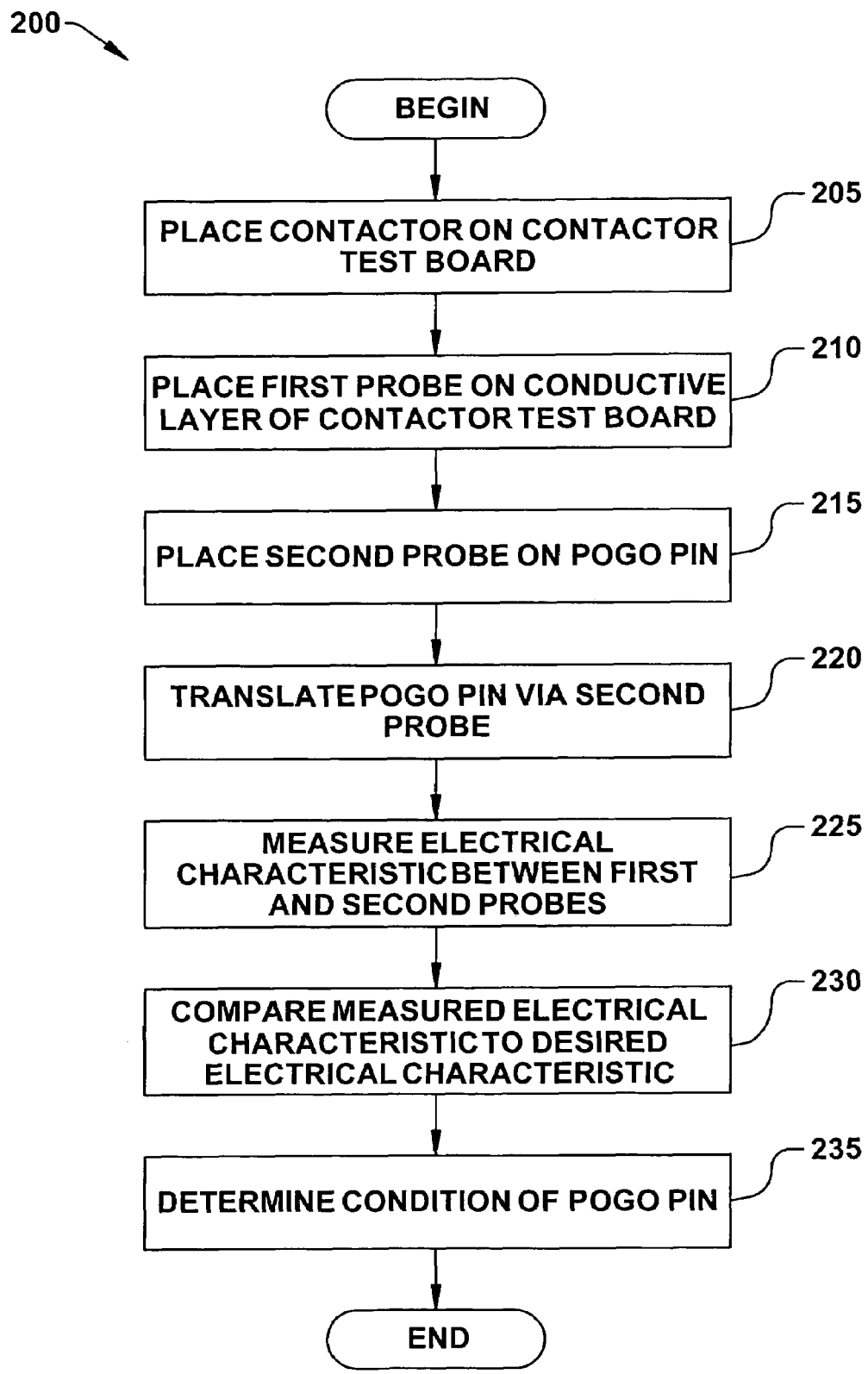
FIG. 5 is a block diagram schematic of a method for characterizing a contactor in accordance with the present invention.

According to another aspect of the present invention, FIG. 5 is a block diagram illustrating a method 200 for characterizing a contactor used in semiconductor device testing. The characterization, for example, may comprise testing, validating, and/or monitoring a contactor, such as the contactor 104 of FIGS. 2 and 3. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 200 begins with act 205, wherein a contactor is placed on a contactor test board. The contactor test board, for example, is positioned within an automated test apparatus, as described above. In act 210, a first probe of the automated test apparatus is placed in contact with a conductive layer of the contactor test board. The conductive layer, for example, may comprise the first electrically conductive layer 138 and/or the second electrically conductive layer 152 of FIGS. 3A-3B, wherein good electrical contact is made between the first probe 146 and the conductive layer.

In act 215 of FIG. 5, a second probe is positioned on a first end of a contactor pin of the contactor, wherein the contactor pin is operable to linearly translate within the contactor. For example, the second probe 148 of FIG. 3A is placed on the first end 160 of the contactor pin 108. In act 220 of FIG. 5, a predetermined pressure is applied to the contactor pin via the second probe, wherein a second end of the contactor pin is translated toward the contactor test board. FIG. 3B, for example, illustrates the contactor pin 108 (and accordingly, the second end 164 of the contactor pin) being translated within the contactor 104 by the optimal distance 166 by the downward pressure 162 applied to contactor pin through the second probe 148. The predetermined pressure applied to each contactor pin via the second probe 148, for example, may be controlled by a predetermined control scheme (e.g., control program) associated with the automated test equipment, wherein the position of and/or pressure applied by the second probe is controlled and monitored by the predetermined control scheme.

In act 225 of FIG. 5, one or more electrical characteristics of the contactor pin are measured between the first probe and the second probe. Measuring the one or more electrical characteristics, for example, may comprise measuring one or more of resistance, inductance, and capacitance via the automated test apparatus. For example, the electrical resistance across the contactor pin 108 of FIG. 3B is measured in act 225 from the first probe 146, through the first electrically conductive layer 138 and/or the second electrically conductive layer 152, through the contactor pin 108, and to the second probe 148. The first and/or second electrically conductive layers 138 and 152, for example, advantageously provide a minimal resistance, inductance, and/or capacitance in accordance with the present invention.

In act 230 of FIG. 5, the measured electrical characteristic is compared to a desired electrical characteristic for the contactor pin, wherein a condition of the contactor pin is determined in act 235 based on the comparison of the measured electrical characteristic and the desired electrical characteristic. Any resistance, inductance, and/or capacitance associated with the first and/or second electrically conductive layers 138 and 152, for example, can be accounted for in the measurement of act 225 of FIG. 5, wherein the resistance, inductance, and/or capacitance of the contactor pin 108 between the first end 160 and second end 164 thereof is accurately determined. Alternatively, the electrical characteristics of the first and/or second electrically conductive layers 138 and 152 of FIGS. 3A-3B can be accounted for in the desired electrical characteristic, wherein the contactor pin 108 is accurately characterized.

The determination of the condition of the contactor pin in act 235 of FIG. 5, for example, comprises determining a fault condition of the contactor pin, wherein the contactor pin is determined to be faulty if the measured electrical characteristic does not match the desired electrical characteristic within a predetermined range. For example, the predetermined range in which the measured electrical characteristic(s) must fall for the contactor pin to not be considered faulty can be determined by empirical data; for instance, such as when the condition of the contactor pin provides accurate test results when testing an IC package. If the contactor pin is determined to be faulty, the individual contactor pin can be replaced or cleaned.

It should be noted that while FIG. 3B illustrates the contactor pin 108 contacting the contact test board 120, the second end 164 of the contactor pin may or may not contact the contactor test board upon the application of the downward pressure 162. In a circumstance wherein the second end 164 of the contactor pin 108 does not contact the contactor test board 120, the contactor pin would still be accurately characterized by the present methodology, since the comparison between the measured electrical characteristic and the desired electrical characteristic in act 230 of FIG. 5 would yield a substantial difference, wherein the condition of the contactor pin would be determined to be faulty in act 235, and appropriate cleaning and/or replacement measures can be taken.

Furthermore, the present methodology allows a characterization of a plurality of contactor pins, wherein the condition of each contactor pin can be stored and/or monitored through the use of the contactor. Such a storage and/or monitoring of the contactor pin characterization(s) can be highly useful in determining scheduled or unscheduled maintenance, as well as providing performance feedback for the contactor. For example, the present invention can be used to determine contamination build-up associated with the contactor pins, wherein the characterization of the contactor pins over time can lead to more efficient contactor cleaning schedules. Further, the automated test apparatus may, for example, cycle through testing the plurality of contactor pins under the predetermined control scheme, wherein the condition of the contactor pins can be analyzed individually, or as a whole.

Also, since actual degradation of the contactor pins over time can be accurately monitored, the faulty contactor pins can be identified and replaced as needed, as opposed to replacing all of the contactor pins when only one or a few may need to be replaced and/or cleaned. Accordingly, the present invention enables an IC package testing facility to repair and/or replace only the contactor pins that require repair and/or replacement, and diagnosis of the contactor can be performed quickly and with significant ease. Further still, the present invention provides for faster debugging of contactor problems, thus leading to cost savings. The present invention can also be practiced off-line from automated test equipment (ATE) used in testing IC packages, wherein the ATE can be used to generate revenue instead of diagnosing contactors.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method for characterizing a contactor for automated semiconductor device testing, the method comprising:
   placing the contactor on a contactor test board positioned within an automated test apparatus;
   contacting a first probe of the automated test apparatus to a conductive layer of the contactor test board;
   placing a second probe on a first end of a contactor pin of the contactor, wherein the contactor pin is operable to linearly translate within the contactor;
   applying a predetermined pressure to the contactor pin via the second probe, therein translating a second end of the contactor pin toward the contactor test board;
   measuring an electrical characteristic of the contactor pin between the first probe and the second probe;
   comparing the measured electrical characteristic to a desired electrical characteristic;
   determining a condition of the contactor pin based on the comparison of the measured electrical characteristic and the desired electrical characteristic; and
   approving the contactor pin if the measured electrical characteristic matches a desired electrical characteristic within a predetermined range.

2. The method of claim 1, wherein one or more of the first and second probes comprise a flying probe.

3. The method of claim 1, wherein applying the predetermined pressure to the contactor pin contacts the second end of the contactor pin to the conductive layer of the contactor test board.

4. The method of claim 1, wherein the measured electrical characteristic and desired electrical characteristic are selected from a group consisting of resistance, inductance, and capacitance.

5. The method of claim 1, wherein determining the condition of the contactor pin comprises determining a fault condition if the measured electrical characteristic does not match the desired electrical characteristic within a predetermined range.

6. The method of claim 5, further comprising replacing the contactor pin with a replacement contactor pin if the fault condition is determined.

7. The method of claim 1, further comprising cleaning the contactor pin if a fault condition is determined.

8. The method of claim 1, further comprising storing the condition of the contactor pin.

9. The method of claim 1, wherein placing the contactor on the contactor test board comprises aligning and fixing a position of the contactor with respect to the contactor test board.

10. The method of claim 9, wherein aligning and fixing the position of the contactor with respect to the contactor test board comprises and inserting one or more locating pins associated with the contactor into one or more respective alignment holes associated with the contactor test board.

11. The method of claim 9, wherein aligning and fixing the position of the contactor with respect to the contactor test board comprises inserting one or more screws through one or more respective thru-holes associated with the contactor test board and threading the one or more screws into one or more threaded holes associated with the contactor, therein sandwiching the contactor test board between the contactor and one or more screw heads of the respective one or more screws.

12. A contactor test board for automated testing of a contactor with and automated test apparatus; the contactor test board comprising:
   a base board having a first electrically conductive layer disposed on a front side thereof, wherein the first electrically conductive layer defines a first surface of the contactor test board;
   a contactor footprint defined on the first surface of the contactor test board by one or more holes through the base board and first electrically conductive layer, wherein the one or more holes are associated with one or more locating pins of the contactor;
   a contactor pin contacting region defined on the first surface, wherein one or more contactor pins associated with the contactor are operable to be positioned over the contactor pin contacting region when the one or more locating pins of the contactor are inserted into the one or more holes in the base board and first electrically conductive layer; and
   a first probe contacting region defined on the first surface, wherein a first probe of the automated test apparatus is operable to contact the first electrically conductive layer in the first probe contacting region, and wherein the first probe contacting region and the contactor pin contacting region are electrically connected via the first electrically conductive layer.

13. The contactor test board of claim 12, wherein the first electrically conductive layer is comprised of one or more of copper, gold, and nickel.

14. The contactor test board of claim 12, comprising a plurality of differing contactor footprints defined on the first surface of the base board, wherein the plurality of differing contactor footprints are associated with a respective plurality of differing contactors.

15. The contactor test board of claim 12 wherein the base board is comprised of an electrically insulative material.

16. The contactor test board of claim 12, further comprising a second electrically conductive layer disposed on a backside of the base board and electrically connected to the first electrically conductive layer by one or more electrically conductive vias through the base board.

17. The contactor test board of claim 16, wherein the second electrically conductive layer is comprised of one or more of copper, gold, and nickel.

18. A method for characterizing a contactor for automated semiconductor device testing in an automated test apparatus, the method comprising:
    placing the contactor on a contactor test board positioned within the automated test apparatus, wherein the contactor test board comprises an electrically conductive layer formed thereon;
    contacting a first flying probe of the automated test apparatus to the electrically conducive layer of the contactor test board;
    placing a second flying probe on a first end of a contactor pin of the contactor, therein linearly translating the contactor pin a predetermined amount;
    measuring an electrical resistance between the first flying probe and the second flying probe, wherein an electrical path between the first flying probe and the second flying probe is formed through the contactor pin and the electrically conductive layer;
    determining a condition of the contactor pin based on the measured electrical resistance and a desired electrical resistance; and
    approving the contactor pin if the measured electrical characteristic matches a desired electrical characteristic within a predetermined range.

19. The method of claim 18, the determination of the condition of the contactor pin is based on a comparison of the measured electrical resistance and a desired electrical resistance, wherein the desired electrical resistance accounts for electrical resistance associated with the electrically conductive layer.

20. The method of claim 18, further comprising replacing the contactor pin if the condition of the contactor pin is determined to be faulty.

* * * * *